(12) United States Patent
Muthukumar et al.

(10) Patent No.: US 7,378,742 B2
(45) Date of Patent: May 27, 2008

(54) COMPLIANT INTERCONNECTS FOR SEMICONDUCTORS AND MICROMACHINES

(75) Inventors: Sriram Muthukumar, Chandler, AZ (US); Charles D. Hill, Gilbert, AZ (US); Chandrasekhar Ramaswamy, Chandler, AZ (US); Patrick Dunaway, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 10/974,219

(22) Filed: Oct. 27, 2004

(65) Prior Publication Data

US 2006/0087032 A1   Apr. 27, 2006

(51) Int. Cl.
*H01L 23/48* (2006.01)
*H01L 23/52* (2006.01)
*H01L 29/40* (2006.01)

(52) U.S. Cl. ............................ 257/773; 257/E23.078

(58) Field of Classification Search ................ 361/772, 361/773, 774, 775; 257/669, 674, 773; 174/260
See application file for complete search history.

(56) References Cited

U.S. PATENT DOCUMENTS

| | | | | |
|---|---|---|---|---|
| 3,842,189 A | * | 10/1974 | Southgate | 174/547 |
| 5,139,427 A | * | 8/1992 | Boyd et al. | 439/66 |
| 5,152,695 A | * | 10/1992 | Grabbe et al. | 439/71 |
| 5,926,951 A | * | 7/1999 | Khandros et al. | 29/843 |
| 6,680,536 B2 | * | 1/2004 | Hattori et al. | 257/739 |
| 6,807,064 B2 | * | 10/2004 | Hedler et al. | 361/767 |
| 6,837,719 B2 | * | 1/2005 | Panella | 439/67 |
| 6,844,214 B1 | * | 1/2005 | Mei et al. | 438/52 |
| 6,873,719 B1 | * | 3/2005 | Holley | 382/133 |
| 6,888,362 B2 | * | 5/2005 | Eldridge et al. | 324/757 |
| 6,939,143 B2 | * | 9/2005 | Rathburn | 439/66 |
| 7,015,584 B2 | * | 3/2006 | Chow et al. | 257/773 |
| 2002/0051351 A1 | * | 5/2002 | Maurer et al. | 361/772 |

OTHER PUBLICATIONS

Zhu et al., "Development of G-Helix Structure as Off-Chip Interconnect", Journal of Electronic Packaging, Jun. 2004, vol. 126, pp. 237-246.

* cited by examiner

*Primary Examiner*—David A Zarneke
(74) *Attorney, Agent, or Firm*—Blakely, Sokoloff, Taylor & Zafman LLP

(57) ABSTRACT

A compliant interconnect is described that is useful for coupling semiconductor dies to other components. In one embodiment, the interconnect includes a base to couple to a first component and an arch extending from and integral with the base to couple to a second component. The interconnect may be formed by coating a substrate with photoresist, exposing the photoresist with a defined pattern, developing the photoresist, baking the photoresist at a first temperature for a first amount of time to reflow the photoresist, and baking the photoresist at a second higher temperature for a second amount of time to reflow the photoresist.

22 Claims, 8 Drawing Sheets

COMPLIANT INTERCONNECTS FOR SEMICONDUCTORS AND MICROMACHINES

BACKGROUND

1. Field

The present description relates to electrical interconnections for semiconductors and micromachines, and, in particular, to compliant interconnects between a die and a package that can be formed using photolithography technology.

2. Background

In a typical IC package, a semiconductor wafer is fabricated using processes like photolithography, etching, chemical vapor deposition and acid washing. The wafer is cut into individual dies or chips. Each die is attached to a substrate that is then mounted onto a printed circuit board. A cover is attached to the substrate to cover, seal and protect the die. The die has electrical interconnects to the substrate, and the substrate provides connections to a socket or a main printed circuit board. The substrate has a much larger surface than the die, so larger and simpler connectors, such as wire pins, solder balls, and coils may be used. For the connection between the die and the substrate, however, these conventional larger interconnections limit how small and complex a die may become.

Rapid advances in IC (Integrated Circuit) design and fabrication continue to challenge and push electronic packaging technology in size, performance, cost, and reliability. One aspect of these advances is the decreasing amount of space available on an IC to connect the IC to the external environment for power and data communications. As more and more connections are forced into a smaller space, the conventional wire pins, solder balls and other large structures will no longer fit on the outside surface of the IC. In addition, wire pins and solder balls do not provide the reliability, performance, cost, and ease of manufacture needed for high volume IC manufacturing in these size ranges.

As an example, solder bumps, such as C4 (Controlled-Collapse Chip Connection) bumps, are being increasingly used for microelectronics packaging. Solder bumps allow for smaller chip size, more input and output connectors and shorter connection paths. However, because of the large difference in coefficients of thermal expansion between the chip and the substrate to which the chip is connected, an underfill material is often applied surrounding the solder bumps. The underfill reduces the shear strain in the solder bump caused by the different rates of expansion and contraction as the chip heats and cools. Unfortunately, the underfill adds a step to the manufacturing process and prevents the components from being disconnected for rework.

To eliminate the complex, and tedious underfill and solder reflow processes and to allow for interconnections that are even smaller and closer together, compliant interconnects have been proposed that can be fabricated using conventional photolithography and electroplating technologies. By integrating the fabrication of the interconnects with the fabrication of the rest of the chip's wafer-level processing, the cost of making the interconnects can be kept low.

Interconnect structures and other structures can be made in a variety of different ways. One proposed technology is with conventional photoresist layering, developing and etching techniques. In conventional photoresist processing, the photoresist is applied in a solid layer, exposed to light in a two-dimensional pattern, and then either the exposed or unexposed portion is etched off, leaving the two-dimensional pattern with a thickness equal to the original photoresist layer.

In order to add a third dimension to the shape, solvents have been used to reflow the photoresist into curved forms. The solvents are diffused over the photoresist in a constant pressure partial vacuum and at a constant temperature. However, even at constant temperature and pressure, the shape of the photoresist structure is difficult to control and the solvent acts inconsistently. The resulting structures are uneven and irregular. When elongated half cylinders are made the structures vary in height and width along their length.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

The mechanical design of an interconnect affects the thermal, mechanical and electrical characteristics of the interconnect. However, many interconnect designs that offer good compliance also have a high resistance and inductance. An improved design for a compliant interconnect that can be used for many different applications is described herein. The design combines excellent thermal, mechanical and electrical characteristics. One application of such an interconnect is to connect a semiconductor die or IC to a package. The described designs may be fabricated using a polymer dome reflow process that reflows photoresist using temperature instead of solvents. This is a low-cost process that can easily be performed using conventional semiconductor fabrication equipment.

The described designs feature an optimization of compliant interconnect (CI) structures to provide the desired thermal, mechanical and electrical performance in the environment of low-K ILD (Inter-Layer Dielectric) architectures. The compliance offered by the optimized designs improves reliability in the face of the stresses typically created in such low-K ILD architectures. The electrical performance meets the power delivery and current flow requirements of proposed future microprocessor die packages. In addition, modifications of the design allow interconnect layouts to be optimized for maximum performance. Highly compliant interconnects may be located near the edges of the die and lower resistance compliant interconnects may be located away from the die edges and in regions where power delivery and current flow demands are higher.

Figure 1:
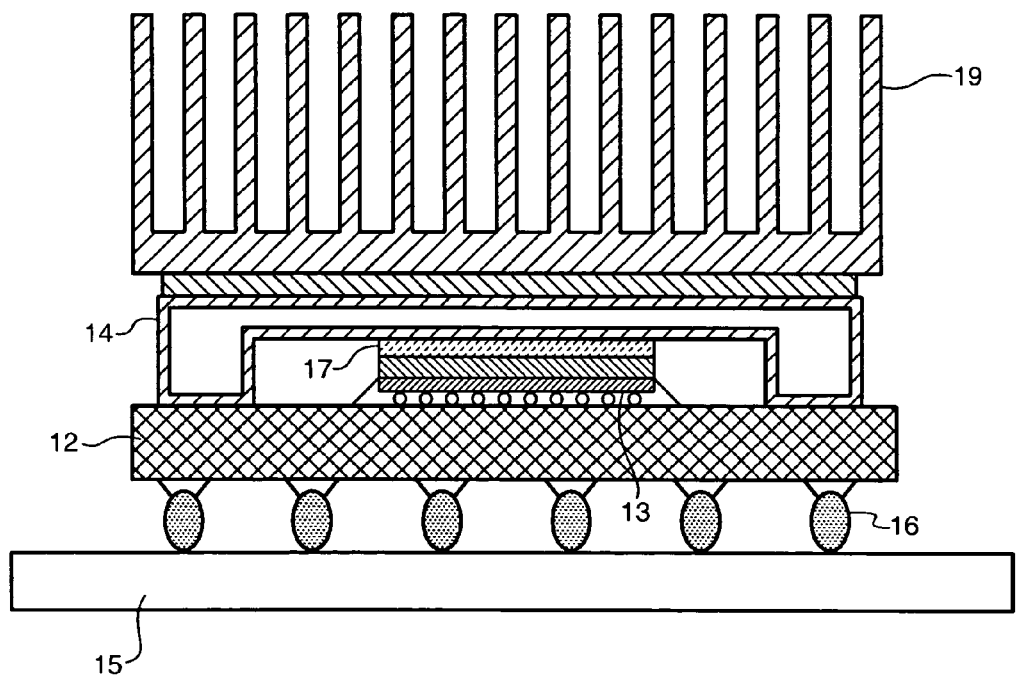
FIG. 1 is a cross-sectional diagram of a semiconductor die mounted in a package using interconnects, wherein the package is, in turn, mounted to a substrate using further interconnects.

FIG. 1 shows a cross-sectional diagram of an IC (Integrated Circuit) chip package coupled to a PCB (Printed Circuit Board). The package has an IC, die, or chip 11 attached to a package substrate 12. The IC may be any of a variety of different types including a microprocessor, microcontroller, ASIC (Application Specific Integrated Circuit), FPGA (Field Programmable Gate Array), DSP (Digital Signal Processor), memory, I/O (Input/Output) controller or hub, etc. The substrate has data, control, and power interfaces 13 to the chip coupled to ground, power and signaling planes within the substrate. The substrate may be formed from any rigid dielectric substrate, such as a standard PC (printed circuit) board material, for example, FR-4 epoxy-glass, polyimide-glass, benzocyclobutene, Teflon, other epoxy resins, injection molded plastic or the like or ceramic. In one embodiment, the substrate is about 40 mils (1.0 mm) thick although it may be thicker or thinner, in other embodiments. The die is coupled to the substrate using a set of connectors 13, such as the connectors shown in FIG. 2, 3, or 4.

The package includes a cover 14 to seal the die and protect it from the external environment. The cover may be hermetically sealed to the substrate. In one embodiment, the cover is an IHS (Integrated Heat Spreader) thermally coupled to the die to transfer heat from the die to the package exterior. The IHS is thermally coupled using a TIM (Thermal Interface Material) 17 such as a solder or thermal grease. However, other types of covers may also be used.

The package substrate 12 is coupled to a second substrate 15 which may be a socket, a motherboard, a daughtercard, a cartridge substrate, a flexboard or any other substrate which may carry the package. In one embodiment, the second substrate is a conventional PCB, PWB (Printed Wiring Board) or a socket mounted to such a board. The land side of the package substrate is mounted to the second substrate using a set of connectors 16. These connectors may include power, ground and signaling connectors or a subset of such connectors. The connectors may be implemented using any of a variety of different technologies including BGA (ball grid array), SMT (Surface Mount Technology), LGA (Land Grid Array) or any of a variety of solder reflow technologies.

As can be seen in FIG. 1, the package substrate 12 couples the die 11 through the die interconnects 13 and the package substrate to the socket or circuit board 15. Vias through the package substrate connect the various package substrate planes (not shown) for ground, power and signaling to the die interconnects.

The example of FIG. 1 also includes a heat sink 19 thermally coupled to the package cover or IHS using, for example a TIM (Thermal Interface Material) or a spring connector. The heat sink has a set of pins or fins to present a large surface area to the ambient outside the package. The heat sink may be augmented by a fan or some other cooler. Alternatively, any of a variety of other cooling devices may be used, including heat pipes, liquid coolers, etc.

Figure 2:
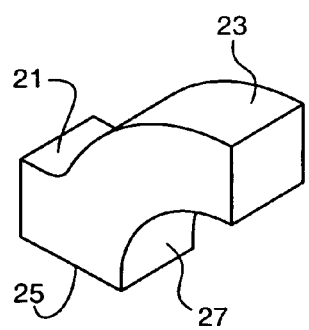
FIG. 2 is a perspective drawing of an interconnect according to an embodiment of the invention.

FIG. 2 shows an example of an interconnect design that may be used for the interconnects 13 of FIG. 1. In FIG. 2, the interconnect has a base 21 that is coupled to the die and an arch 23 that extends from the base to make contact with the substrate. The base of the interconnect may alternatively be attached to the substrate so that the arch contacts the die. The base is shown as an elongated beam with a bottom surface 25 to contact the surface of the die. The base may contact the die at a connection pad formed on the die for the purpose of electrically connecting to the base. The base also has an elbow 27 at one end of the elongation to meet the arch. The beam may have a square cross-section about 20 µm in each direction and be about 50 µm long. The particular dimensions and proportions may be adapted to suit any particular application.

In the example of FIG. 2, the arch is formed roughly as a quarter of a circle so that it rises perpendicularly from the beam up away from the die surface and then curves away from the beam. A tangent to the arch where it meets the beam will be normal to the plane of the die surface, while a tangent to the arch at its other end will be parallel to the plane of the die surface. If the portion of the circle where the arch meets the elbow is identified as 0 degrees on a circular compass, then the other end of the arch is at 90 degrees from the elbow, along the circle. The arch may also have a square cross-section that is about 20 µm in height and width.

The arch may be formed as a smaller or larger part of a circle, or it may be formed as a portion of a noncircular curve instead of a circular curve as shown. The arch may extend beyond the quarter circle or 90 degrees to provide a longer or differently shaped surface to attach to the substrate. The particular radius of curvature, or radii of curvature if the arch is not circular in shape, may be selected to provide the desired mechanical properties. In one example, the beam and arch combined are 90 µm long and the arch has a circular radius of curvature of 40 µm. The particular dimensions and relative sizes of the beam and arch may be adapted to suit particular mechanical and electrical characteristics.

When the arch is made from a resilient material, such as a metal, it acts as a spring. The particular design of FIG. 2 has mechanical properties similar to a leaf spring. Modifications to the spring shape may be made to adjust its resiliency, spring constant and other parameters. The arch has a top surface which is the surface farthest from the bottom surface of the beam. This top surface resiliently contacts the package substrate, in this example, to create an electrical connection. The substrate, or any other contacted surface may have a connection pad to provide a clear electrical connection path with the arch.

Figure 3:
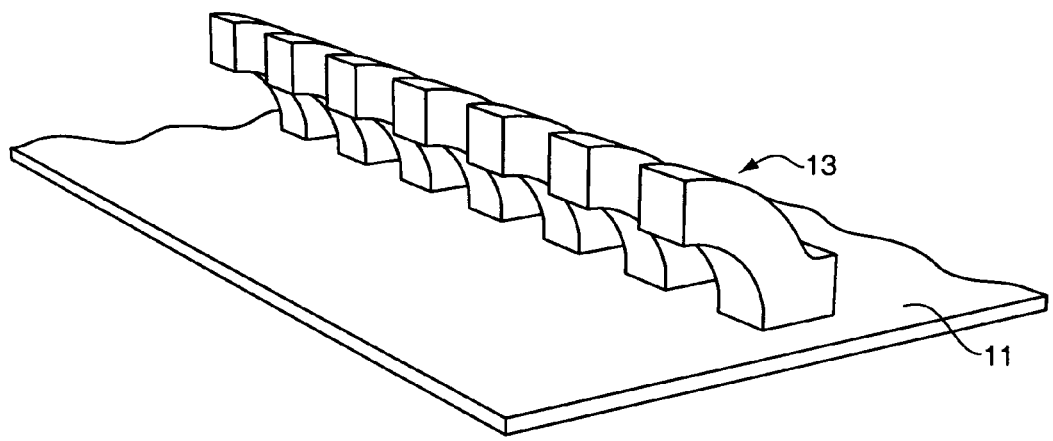
FIG. 3 is a perspective drawing of a set of interconnects mounted to a portion of a semiconductor die according to an embodiment of the invention.

FIG. 3 shows an example of an application of the interconnect of FIG. 2 to a die. The die 11 has an approximately flat surface, the bottom surface as shown in FIG. 1. The interconnects 13 are formed in an array across the surface to permit connection to the substrate of the package. In one example, the interconnects are about 60 µm apart in any one row and the die may have 500, 1000, or more interconnects in total. While only a single row of interconnects are shown, a die may have several rows of interconnects each. The particular number will depend upon the particular die and the particular application for the IC package.

The interconnects of FIG. 3 may also be nested to increase the density of the interconnects. For nesting, the far end of one interconnect beam may be positioned underneath the arch of the neighboring interconnect. The amount of the beam that is underneath the neighboring arch will depend on the desired density. The interconnects may also be placed in an alternating array so that the beams are between neighboring arches.

Figure 4:
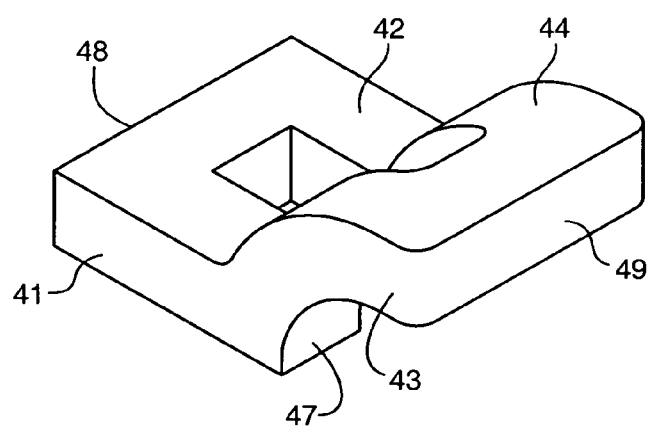
FIG. 4 is a perspective drawing of an interconnect according to another embodiment of the invention.

In the example of FIG. 4, two interconnects, each with a beam and an arch similar to that shown in FIG. 2 are connected together to form a single integral compliant interconnect structure. The first half of the interconnect has a first beam 41 that connects to a first arch 43 at its elbow 47. This portion of the interconnect is very similar in shape to the interconnect of FIG. 2. A second half of the interconnect also has a second beam 42 that is roughly parallel to and aligned with the first beam. A second arch 44 extends from the second beam at an elbow. This portion of the interconnect is similar in size and shape to the first portion of the interconnect.

The two portions of the interconnect are connected by at least one crossbar. In the illustrated example, the beams are connected by a beam crossbar 48 that connects the ends of the two beams that are opposite the elbows. In the illustrated example, the crossbar has about the same height and width as the beams and has a length of about 70 μm, also about the same as the beams.

This beam crossbar provides a larger surface to make electrical and mechanical contact with a connection surface on the die, for example a C4 pad. The crossbar may be positioned anywhere along the lengths of the two beams for this purpose. Additional crossbars may be added to connect the beam for electrical or mechanical reasons. In addition to providing a larger contact surface, the crossbar also shunts the two beams so that they carry the same signal to the arches.

A second crossbar 49 connects the ends of the two arches opposite the beams. This crossbar has about the same dimensions as the beam crossbar and shunts the two arches. By shunting across the two arches, impedances between the two arches may be reduced. This same shunt may also be provided by the substrate connector to which both arches will be attached. The arch crossbeam also provides a larger surface for the connection to the substrate, which may be, for example, a C4 pad as well.

The crossbar shown in FIG. 4, by adding to the surface area of the electrical contact may make it significantly easier to align the interconnect with the connection pads to which they are to be connected. In one embodiment, the interconnect structures are formed on the surface of the die and, in a separate process, a grid of pads are deposited on the surface of the substrate. To connect the die to the substrate, the die must be aligned so that each of the interconnects is aligned with the appropriate pad and do not come too close to contacting any other pad. The larger area of the contact surfaces in the interconnects of FIG. 4 make this alignment easier.

The crossbars also provide greater stiffness to the interconnect structure. Additional crossbars may be added in different locations in order to further increase the stiffness. The crossbars may also be shaped or angled to achieve particular mechanical properties. In the example of FIG. 4, both crossbars are parallel to each other and perpendicular to the parallel beams. The crossbars may instead be at an angle to form cross-braces. X, Y and other patterns may be formed to stiffen the interconnect structure in particular directions.

Figure 5:
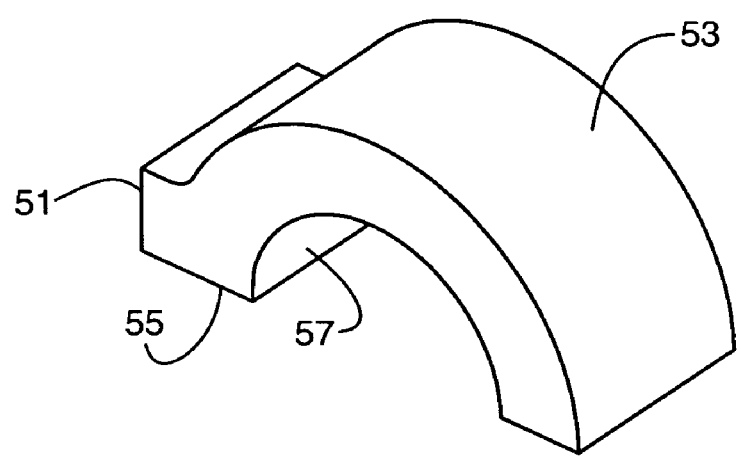
FIG. 5 is a perspective drawing of an interconnect according to another embodiment of the invention.

FIG. 5 shows an example of an interconnect design similar to that of FIG. 2 but significantly broader and with a longer arch. The width eases alignment with connection pads and increases the spring constant or resiliency of the arch portion. The longer arch increases resiliency still more. Like the CI of FIG. 2, the CI of FIG. 5 has a base 51 that is coupled to the die and an arch 53 that extends from the base to make contact with the substrate. The base is formed as an elongated beam with a bottom surface 55 to contact the surface of the die and an elbow 57 at one end of the elongation to meet the arch. The beam is much wider than that of FIG. 2 with a similar height of about 20 μm but a width of about 60 μm. This width may include a smaller square bond pad 20 μm in each direction on its bottom surface. The arch is similarly about 60 μm wide. However, in the example of FIG. 5, the arch extends through a half circle, 180 degrees, rather than the quarter circle of FIG. 2. The far end of the arch meets with the surface of the die. The remaining dimensions may be similar to those of the CI of FIG. 2. Similar modifications and variations to those described above for the example of FIG. 2 may also be made.

Figure 6:
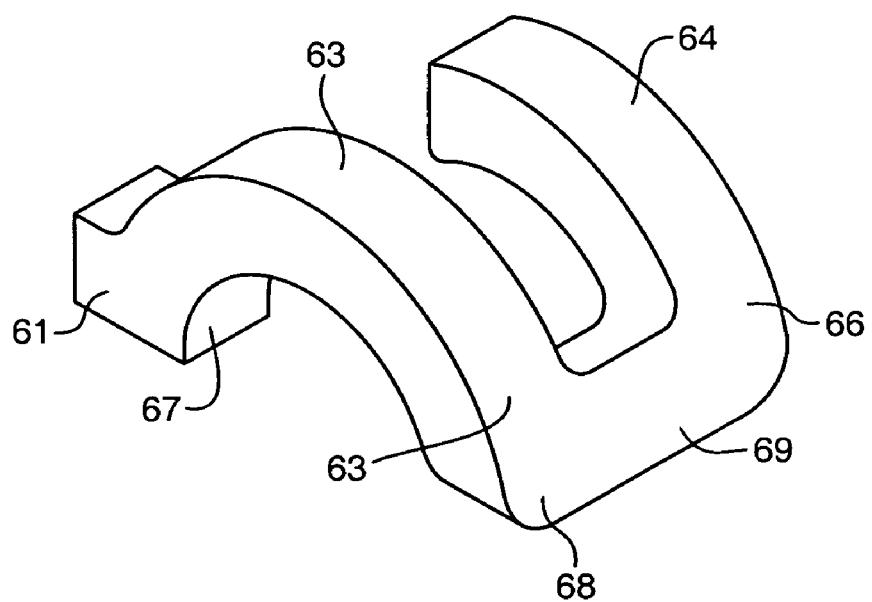
FIG. 6 is a perspective drawing of an interconnect according to another embodiment of the invention.

FIG. 6 shows another modification to the interconnect design of FIG. 2. In the example of FIG. 6, a beam 61, similar to the beam of FIG. 2 extends along the surface of the die and connects at an elbow 67 to an arch 63. Unlike the arch of FIG. 2, this arch extends through a semicircle away from the surface of the die and then back into contact with the surface of the die at a second elbow 68, a short distance from the beam. The arch extends 180 degrees from the first elbow 67 to the second elbow 68. A second arch 64 parallel to and aligned with the first arch is separated from the arch by a short distance, 70 μm in the example shown. The two arches are joined together by a crossbar 69. The crossbar is attached to the first arch's second elbow 68 and to an elbow 66 on the second arch directly across from the first arch's second elbow.

The second arch forms a quarter circle similar in shape to the arch of FIG. 2. The two arches are similar in shape and size to the two arches of FIG. 4. However, by extending the first arch another quarter circle back to the die surface, the two arches may be connected on the die surface away from the beam. This significantly changes the mechanical properties of the interconnect. The crossbar in FIG. 5, similar to those of FIG. 4 is perpendicular to the beams and extends across the surface of the die to connect the two arches at their respective elbows. In one example, the arches are 40 μm in radius, as in FIGS. 2 and 4, and the distance from the beam to the end of the half circle arch may be 140 μm.

Figure 7:
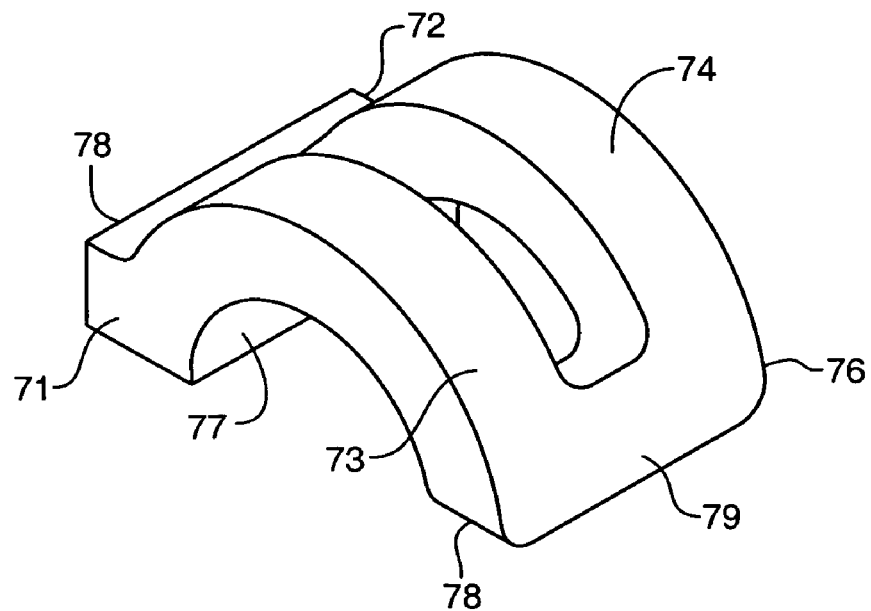
FIG. 7 is a perspective drawing of an interconnect according to another embodiment of the invention.

FIG. 7 shows a further variation on the CI structures described above. The example of FIG. 7 is similar to that of FIG. 6 except that the second arch follows a complete semicircle to join with a second beam 72. The first and second beams 71, 72 are similar to the beams of FIG. 6 and are coupled together with a shunt 78. Both beams, opposite the shunt, connect at respective elbows 77 to respective arches 73, 74. Both arches extend through a semicircle away from the surface of the die and then back into contact with the surface of the die at respective second elbows 78, 76, a short distance from the beam.

The arches are parallel to and aligned with each other and separated from each other by a short distance. In this example, the arches are each 31 μm wide and 30 μm apart. The beams are similarly 31 μm wide and 30 μm apart. The two arches are joined together by a crossbar 79 that is attached to the two arches' respective elbows 76, 78. The interconnect of FIG. 7 combines features of the FIG. 5 and FIG. 5 interconnects to provide low resistivity, a large contact pad and a very stiff, resilient spring character.

In tests, the mechanical and electrical characteristics of the five different variations of compliant interconnects (CI) may be quantified. The version of FIG. 6 provides higher compliance, while the version of FIG. 4 provides less electrical resistance. The resistance of any of the variations may be reduced further by increasing the cross-sectional area such as in the version of FIG. 5. However, an increased cross-sectional area reduces the compliance of the structure.

Better electrical performance may also be obtained by shunting the CI (as shown in FIGS. 4, 6, and 7 because the current is distributed over a larger area. On the other hand, shunting two arches or using more than one arch per connection point without shunting reduces the compliance in the structure by almost half compared to a single arch. This still provides more compliance than would be provided by an arch with an increased cross-section sufficient to obtain the same reduction in resistance. The version of FIG. 4, for example, shows more compliance and more resistance than the version of FIG. 6, which shows more compliance and more resistance than the version of FIG. 7.

The CI examples described herein are inexpensive to fabricate precisely and in large numbers. They accommodate the movement between a chip and a substrate that is induced by the mismatch in thermal expansion coefficients. They also are compliant in order to accommodate the connecting surface of the die and the substrate not being perfectly flat. This compliance also absorbs uneven pressures on the die or the substrate when the two are pushed together. This helps prevent the die and metal and dielectric layers on the die from cracking. Their electrical properties allow low voltage, high frequency and high current signals to be carried through the interconnects without being negatively affected. The electrical properties include low resistance, low inductance, and high current capacity.

The mechanical and the electrical characteristics of any of the interconnects described herein may be changed with adjustments in the dimensions and shapes of these examples. Thicker structures will often provide less flexibility and less resistance. Compromises between the properties of thicker structures and thinner structures may be obtained in some cases by shunting or bracing thinner structures. The best dimensions of any application may be adapted to suit a particular application. In addition, the dimensions of any interconnect may also be modified to suit a particular form factor. Different applications may require particular shapes and dimensions to fit in the space that is available for the desired number of interconnects. The dimensions and shapes described herein are intended as examples. They are appropriate as interconnects within a package for some microprocessors, however, other applications may require substantially different sizes and shapes.

As compared to a solder bump, the CI structures described herein have more than 100 times the compliance in every direction. This increase in compliance reduces the mechanical stress on the die and reduces the chances of the die, the metal layers or any dielectric layers cracking. The electrical characteristics have been shown to be more than sufficient.

Using the different interconnect designs described above, or variations on these designs, the connection between two devices may be optimized. Different compliant interconnect (CI) designs may be used at different places on a die in order to provide different thermal, mechanical and electrical characteristics. In one embodiment, the characteristics are optimized for low-K ILD based architectures.

Figure 8:
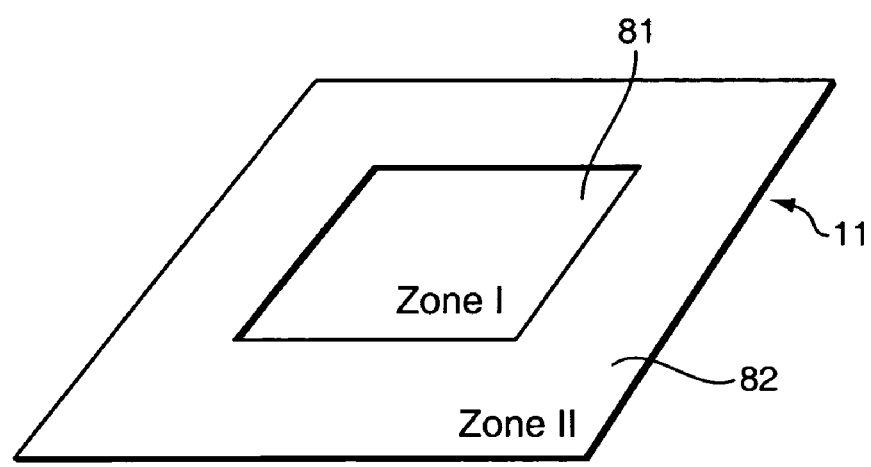
FIG. 8 is a drawing of a surface of a semiconductor die having zones to which different types of interconnects may be applied according to an embodiment of the invention.

As shown in FIG. 8, the surface of a die may be divided into zones. These zones can be used to characterize the important performance characteristics of an interconnect in that area of the surface of the die. While only two zones are shown, other and additional zones may also be identified. The zones may also have different shapes than the simple rectangles of FIG. 8.

In the example of FIG. 8, there is an inner zone 81 where power and current delivery are the most important characteristics and an outer zone 82 in which compliance is most important. In the inner zone, the die is more flat and the effects of thermal expansion and contraction are reduced. In the outer zone surface irregularities in the die, including warpage have a greater influence and thermal expansion and contraction will cause more movement on the surface of the die. Accordingly, a more compliant CI will maintain better contact with the die.

Based on the inner and outer zones, CI's with less resistance such as those shown in FIGS. 5, 6 and 7 may be used. In addition, the die may be designed so that the power connections are in this zone. In the outer zone, a CI such as the one shown in FIG. 2 may be used and the die may be designed so that data connections are coupled in this zone. Performance may be enhanced further in some applications by assigning intermediate zones and by using a variety of different variations on the CI's described herein. In another embodiment, interconnects may be applied to the opposite surface of the die. This allows more interconnects to be used and for the spacing between interconnects to be increased. The interconnects on the silicon side may have different characteristics than those on the top side based on different packaging requirements or electrical needs.

The compliant interconnect described herein may be fabricated in many different ways. In one embodiment, a polymer dome reflow process may be used. Each CI may be formed from one or more metal layers and from several metal compositions deposited upon each other with built in internal stresses. By modifying the number of metal layers, the compositions of the metal layers, and the thickness and order of the metal layers, the thermal, mechanical, and electrical properties of the compliant interconnects may be controlled. The layers may be formed of any of a variety of different materials including metals such as aluminum (Al) copper (Cu), titanium (Ti), nickel (Ni), gold (Au), silver (Ag), tin (Sn), tantalum (Ta), molybdenum (Mo), chromium (Cr), cobalt (Co), or alloys of these and other materials.

Figure 9:
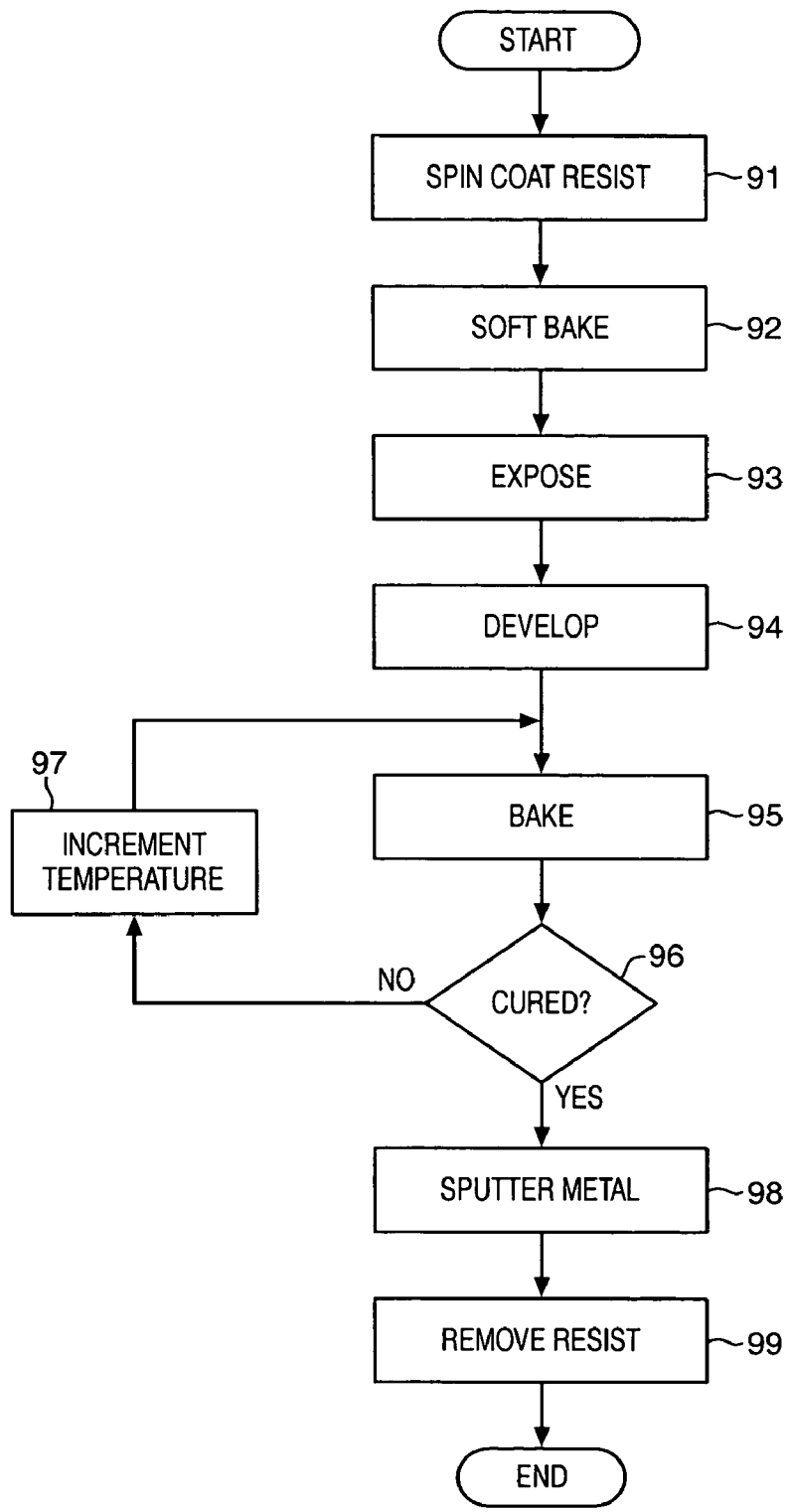
FIG. 9 is a process flow chart of forming an interconnect such as those of FIGS. 2 through 7 according to an embodiment of the invention.

FIG. 9 shows steps that may be used to form photoresist into curved three-dimensional shapes. An example of such a process is a polymer dome reflow process. In the FIG. 9 process, photoresist is deposited or spun onto a die at block 91. The photoresist is soft baked at block 92 and is patterned by exposing at block 93 and developing at block 94 to create a polymer column. The polymer column is reflowed at block 95 by baking it to form a polymer dome using heat. The baking process is performed in several steps. If the dome is not cured at block 96, then the bake temperature and time are adjusted at block 97 and the bake continues until the dome is sufficiently cured. A layer of metal may then be deposited over the polymer dome at block 98. Additional layers may be deposited over this layer and the final shape is obtained using further patterning and etching. The photoresist and the polymer dome are then stripped away at block 99 leaving the shaped compliant interconnect.

Figure 10A:
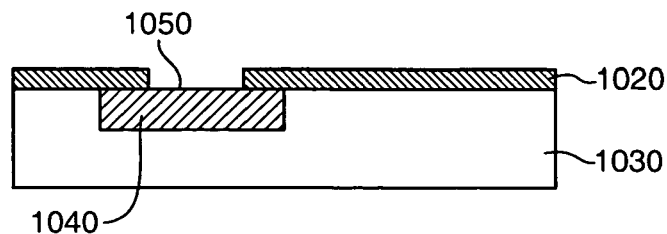
FIGS. 10A through 10H are cross-sectional diagrams of a portion of a die on which an interconnect is formed using the process of FIG. 9.

FIG. 10A shows an example of a die 1030 with an electrical contact pad 1040 and a passivation layer 1020 of dielectric, such as silicon nitride or a polyimide. The passivation layer has an opening 1050 through to the contact pad. The die may be silicon, gallium arsenide, lithium niobate, ceramic or any of a variety of other materials to which photolithography may be applied. The die may be used to carry a semiconductor or a micromechanical device of any of the various types mentioned above. In one example, the die is a microprocessor with semiconductor circuit layers on the bottom side as shown in FIG. 1.

Figure 10B:
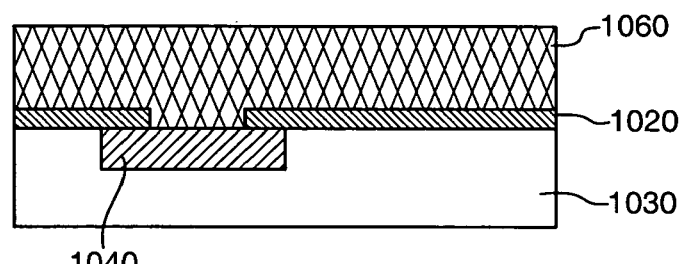

In FIG. 10B a layer of photoresist 1060 has been applied to the die. The photoresist may be a conventional positive photoresist. The photoresist is formed on the top side as shown in FIG. 10B and a layer of conducting planes and connection pads (indicated by the one pad 1040) are formed between the substrate and the photoresist.

Figure 10C:
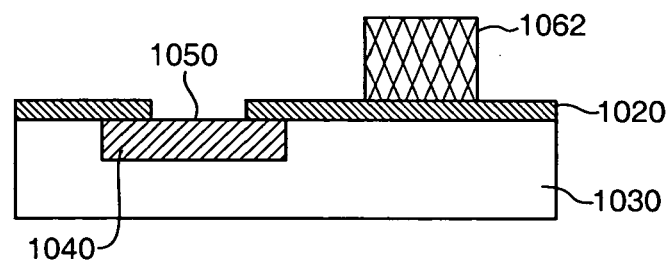

In FIG. 10C, the photoresist is exposed through a mask and developed to form a particular two-dimensional pattern. In some embodiments, the photoresist is first soft baked before being exposed. For example, the photoresist may be baked for 10 minutes at about 100° C. The particular time and temperature may be selected based on the nature of the photoresist and the desired shapes. FIG. 10C shows a cross section of such a two-dimensional feature. This feature may be a post or an elongated rectangle 1062. In one example, the elongated rectangle is about 60 μm high and about 60 μm wide. The rectangles may be 12 mm long or more. The particular dimensions will depend upon the particular structure that is to be formed using the photoresist.

Figure 10D:
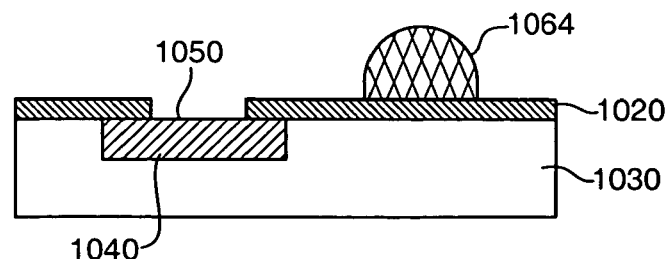

As shown in FIG. 10D, the photoresist rectangle may then be reflowed to form it into a polymer dome 1064 or any other curved shape. Rather than exposing the photoresist to solvent, the photoresist formations may be baked in steps. A first baking step may be used to reflow the column 1062 into a dome 1064. The ramp time, i.e. the time used to reach the end baking temperature, and the baking temperature may depend upon the particular photoresist and the size and shape of the desired forms. For conventional positive photoresist, such as an SJR5740 type photoresist, formed into features from 10 to 100 μm, the first bake may be at about 110° C. for 30 minutes.

Figure 10E:
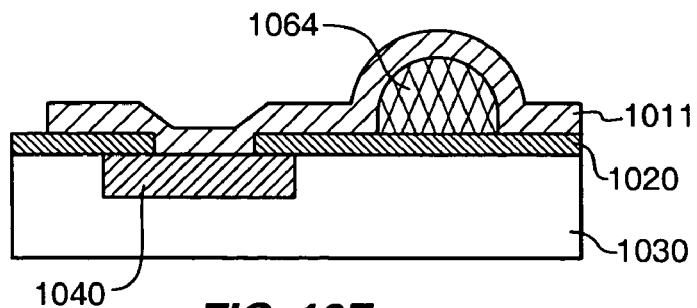

Additional baking steps have an impact on the reflow process but may also be used to remove solvents from the photoresist. This makes the photoresist more rigid and reduces the negative impact that the photoresist solvents may have on later sputtering or deposition steps. On the other hand, the photoresist bake times may be selected to allow the photoresist to retain enough solvents to allow the photoresist to be removed later (FIG. 10H). The outgassing of solvents from the photoresist at a single temperature reduces exponentially over time. As a result, extending the first bake time has very little impact on the amount of solvents that are removed from the photoresist. By increasing the temperature, the rate of outgassing is increased initially. This rate then also decreases exponentially. Additional baking steps at progressively higher temperatures may be used to remove solvents at a faster but precisely controlled rate.

In one example, a second bake at 125° C. for 30 minutes may follow the first bake. Both bakes may be performed in a vacuum environment at a pressure of about 33.0 cm-Hg. In another embodiment, two additional baking steps are added. The second bake may be at 125° C. for 15 minutes and then a third bake may be at 135° C. for 15 minutes. At each temperature increase, the photoresist will initially increase the rate at which solvents are released. By adding additional higher temperature steps, the time used for curing the photoresist may be reduced, reducing processing time and therefore costs.

While the temperatures and the number of baking steps may be adjusted to suit different applications. The ramp time used between each temperature step may also be adjusted to suit different applications. The photoresist reflows as the temperature increases and starts to reflow before the temperature reaches the first bake temperature. Increasing the ramp time may cause the reflow to progress more smoothly. In addition, the photoresist will outgas solvents while the temperature is ramping up. A temperature ramp may be used to ensure a particular rate of outgassing. Only when the temperature is constant does the outgassing rate slow down.

The two-step baking process can cause almost all of the solvents in the photoresist to outgas leaving it sufficiently cured to withstand other processes without significantly changing shape. The final reflowed dome structures are shown in FIG. 10D. The structures in FIG. 10D have a semicircular cross-section instead of the original square cross-section of FIG. 10C. The structures may become lower and wider. In the described example, the 60 μm square cross-section may go to about 80 μm wide and about 45 μm high. The particular change in shape will depend upon the original starting shape, the nature of the photoresist and the baking process. A large variety of different shapes and dimensions may be obtained. The particular baking times, temperatures and the dimensions of the developed photoresist are provided as examples and may be modified to suit a particular application.

By applying a stepped bake to the developed photoresist, a conventional solvent step may be avoided. This reduces processing time and expense and reduces the chances of errors. In addition, it has been found that the shapes formed using a stepped bake instead of a solvent based reflow are much more uniform and consistent. The reflow process can also be more precisely controlled by adjusting temperatures and times than can a solvent process.

The reflowed dome shape shown in FIG. 10D can be used as a form over which the interconnect structures of FIGS. 2, 4, 5, 6, and 7 can be built. FIG. 10E shows a first metal layer 1011 deposited over the dielectric layer 1020, the polymer dome 1064 and the metal contact pad 1040. This metal layer forms the first layer for the CI and may be formed by sputtering, chemical vapor deposition, physical vapor deposition, atomic layer deposition, electro plating, electroless plating, or any of a variety of other techniques.

Figure 10F:
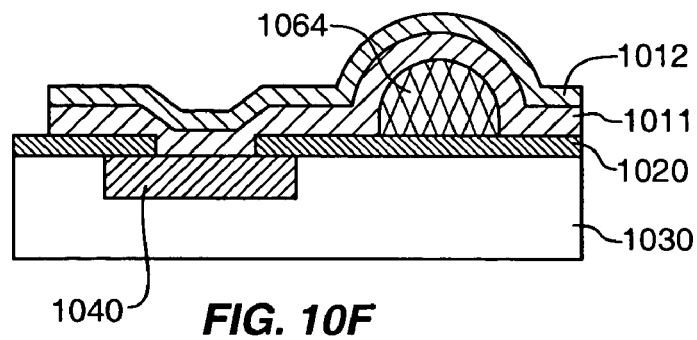

As shown in FIG. 10F, a second metal layer 1012 may be formed over the first metal layer. In the illustrated embodiment, the second layer covers all of the first layer. It may be formed of any type of metal or alloy and applied in the same way or a different way from the first metal layer. A CI may be formed from a single layer of metal or additional layers may be used to adjust the dimensions, or the physical and electrical properties of an interconnect. Additional layers may also be used to provide for bonding and other assembly-related purposes. The particular number and choice of layers may be made to suit any particular application.

Figure 10G:
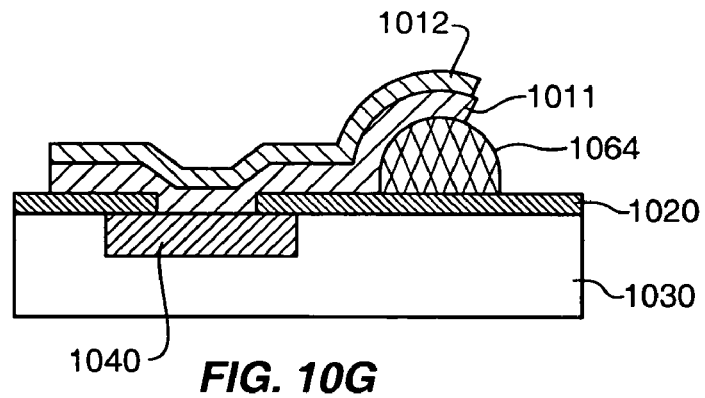
Figure 10H:
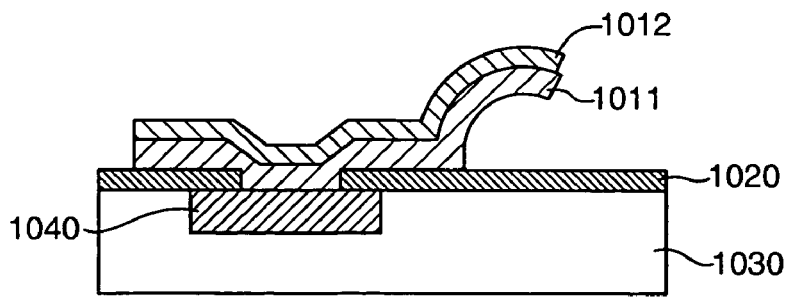

In FIG. 10G, patterning and etching have been applied to remove a portion of the metal layers. Different patterns may be applied to produce any one of the CI designs described above and variations on those designs. The patterning may also be used to control the spacing between CI's in a row. In FIG. 10H, the photoresist polymer dome has been stripped, leaving a two-layer CI having a configuration similar to that of FIG. 2 or 4. The fabrication process shown in FIGS.

10A-10H are provided as one example of how to produce compliant interconnects as described herein. The process may be modified to suit other applications and a variety of different interconnects may be produced using the same or a modified version of the described process.

As mentioned above, one possible application of the CI's described above is to connect a die or chip to the substrate of a package. This package may then be attached to a socket or directly to a printed circuit board. The packaged die may by any one of many different devices commonly used in computers, entertainment systems, telephones and other devices. An example of one such device is the computer system shown in FIG. 9.

Figure 11:
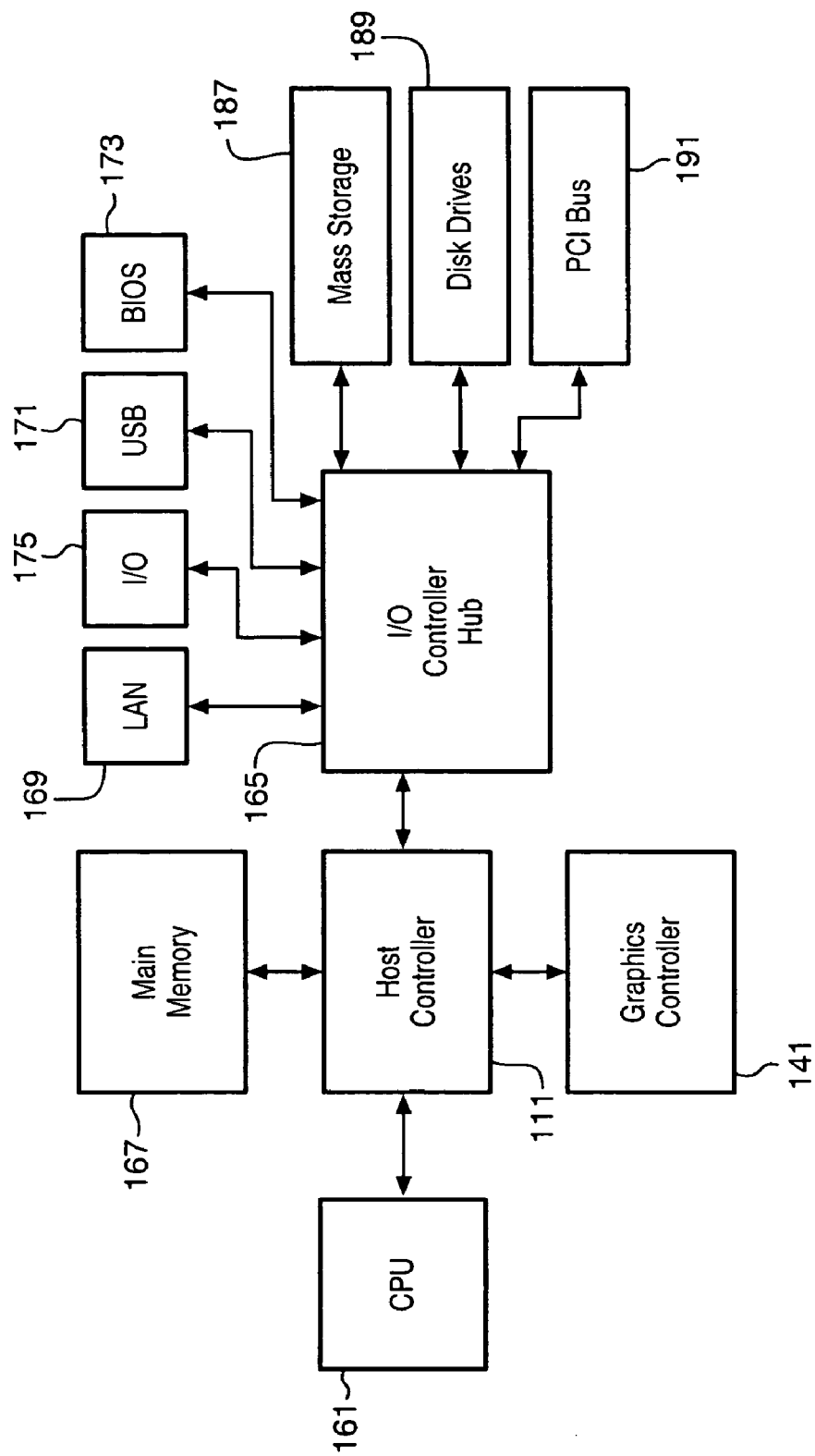
FIG. 11 is a diagram of a computer system to which the present invention may be applied.

FIG. 11 shows an example of a computer system containing several different IC components to which embodiments of the present invention may be applied. Embodiments of the present invention may be adapted for application on a great number of different ICs, including microprocessor packages and chipsets. In this example, the computer system may include a CPU (Central Processing Unit) 161 coupled to a chipset component 111 such as a Memory Controller Hub (MCH) chip. The MCH functions as part of a supporting chipset for the CPU. The MCH is coupled to a main memory 167, such as DRAM (Dynamic Random Access Memory) and to a graphics controller 141.

The MCH 111 is also coupled to an ICH (Input/Output controller hub) 165. The ICH offers connectivity to a wide range of different devices. Well-established conventions and protocols may be used for these connections. The connections may include a LAN (Local Area Network) port 169, a USB hub 171, and a local BIOS (Basic Input/Output System) flash memory 173. A SIO (Super Input/Output) port 175 may provide connectivity for a keyboard, a mouse, and any other human interface devices.

The ICH may also provide an IDE (Integrated Device Electronics) bus for connections to disk drives 187, 189 or other large memory devices. The mass storage may include hard disk drives and optical drives. A PCI (Peripheral Component Interconnect), a PCI-X bus or a PCI-Express bus 191 may be coupled to the ICH to allow a wide range of devices and ports to be coupled to the ICH. The architecture of FIG. 3 allows for a wide range of different functions and capabilities. The specific details of any implementation will depend on the particular application.

The CPU, MCH, ICH, LAN port, USB hub, BIOS, SIO port, IDE and PCI buses may all be carried on a single motherboard of the computer system. Any one or more peripheral devices may also be carried on the motherboard. The computer system may be adapted for use in many different applications including office productivity, communications, entertainment, music and video production or manufacturing.

Although the description of the various embodiments refers primarily to using compliant interconnects in conjunction with an integrated circuit package, the various embodiments may also be used with other types of packages, interposers, PC boards or other electronic circuit housings. The various embodiments may be used with various types of electronic assemblies, and are not to be limited to use with integrated circuit packages.

In addition, the various embodiments may be used with a number of different types of packages and packaging technologies, for example, organic or ceramic packages, and technologies such as land grid array (e.g., organic LGA), pin grid array (e.g., plastic PGA or flip chip PGA), ball grid array (e.g., microBGA, tape BGA, plastic BGA, flip chip BGA or flip chip tape BGA), and beam lead may be used to attach the CI's to a die or a substrate.

It is to be appreciated that a lesser or more complex compliant interconnect, shape, structure or composition and that a lesser or more complex semiconductor package or computer system than the examples described above may be preferred for certain implementations. In addition, lesser or more complex fabrication processes may be preferred for particular implementations. Therefore, the configurations and the processes may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known structures and techniques have not been shown in detail to avoid obscuring the understanding of this description.

While the embodiments of the invention have been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. A compliant electrical interconnect comprising:
    a base in the form of an elongated beam with a bottom surface to electrically couple to a first electronic component;
    an elbow at one end of and integral with the elongated beam; and
    an arch extending perpendicularly away from the bottom surface of the base and curving back toward the base from the perpendicular, the arch being integral with the elbow, to electrically couple to a second electronic component on a top surface, the top surface of the arch being opposite the bottom surface of the base.

2. The interconnect of claim 1, wherein the arch subtends an angle from the base of at least 90 degrees.

3. The interconnect of claim 1, wherein the arch is shaped like a portion of a circle.

4. The interconnect of claim 1, further comprising:
    a second base parallel to the first base;
    a second arch parallel to the first arch; and
    a crossbeam to connect the first base to the second base.

5. The interconnect of claim 4, wherein the crossbeam is perpendicular to the first base.

6. The interconnect of claim 4, further comprising a second crossbeam to connect the first arch to the second arch.

7. The interconnect of claim 1, further comprising:
    a second arch parallel to the first arch; and
    a crossbeam to connect the first arch to the second arch.

8. The interconnect of claim 7, wherein the first arch subtends an angle of 180 degrees and the second arch subtends an angle of 90 degrees.

9. The interconnect of claim 1, wherein the base has a bottom surface to electrically couple to the first component through a connection pad of the first component.

10. A semiconductor die comprising:
an electrical interconnection surface having a plurality of electrical connection pads; and
a plurality of compliant interconnects each coupled to a respective connection pad, each compliant interconnect comprising a base in the form of an elongated beam with a bottom surface electrically coupled to a respective connection pad, an elbow at one end of and integral with the elongated beam and an arch extending perpendicularly away from the bottom surface of the base and curving back toward the base from the perpendicular, the arch being integral with the elbow to electrically couple, to an electronic component on a top surface, the top surface of the arch being opposite the bottom surface of the base.

11. The die of claim 10, further comprising a second electrical interconnection surface opposite the first interconnection surface, the die further comprising a plurality of interconnects coupled to the second interconnection surface.

12. The die of claim 10, further comprising a second electrical interconnection surface proximate the first interconnection surface, the die further comprising a plurality of interconnects coupled to the second interconnection surface, the compliant interconnects of the first interconnection surface being different from the interconnects of the second interconnection surface.

13. The die of claim 12, wherein the second interconnection surface surrounds the periphery of the first interconnection surface.

14. The die of claim 13, wherein the interconnects of the second interconnection surface are more compliant and more resistive than the compliant interconnects of the first interconnection surface.

15. A computer system having a motherboard and a socket mounted to the motherboard, the socket carrying a microprocessor package, the microprocessor package having a die coupled to a substrate by a plurality of compliant electrical interconnects, each compliant interconnect comprising a base in the form of an elongated beam with a bottom surface electrically coupled to a respective connection pad of the die, an elbow at one end of and integral with the elongated beam and an arch extending perpendicularly away from the bottom surface of the base and curving back toward the base from the perpendicular, the arch being integral with the elbow to electrically couple to the substrate on a top surface, the top surface of the arch being opposite the bottom surface of the base.

16. The system of claim 15, wherein the arch subtends an angle from the base of at least 90 degrees.

17. The system of claim 16, wherein the arch is shaped like a portion of a circle.

18. The system of claim 15, wherein each interconnect further comprises:
a second arch parallel to the first arch; and
a crossbeam to connect the first arch to the second arch.

19. The interconnect of claim 1, wherein a top surface of the arch resiliently contacts the substrate to establish an electrical connection.

20. The interconnect of claim 19, wherein a tangent to the top surface is parallel to the base.

21. The die of claim 10, wherein each interconnect comprises a top surface of the arch to resiliently contact the substrate to establish, an electrical connection.

22. The die of claim 21,Wherein a tangent to the top surface of each interconnect is parallel to the base.

* * * * *